United States Patent
Nishimura et al.

(10) Patent No.: US 7,973,583 B2
(45) Date of Patent: Jul. 5, 2011

(54) A/B-PHASE SIGNAL GENERATOR, RD CONVERTER AND ANGLE DETECTION UNIT

(75) Inventors: Hisashi Nishimura, Tokyo (JP); Kenichi Nakazato, Toyko (JP)

(73) Assignee: Japan Aviation Electronics Industry Limited, Tokyo (JP)

( * ) Notice: Subject to any disclaimer, the term of this patent is extended or adjusted under 35 U.S.C. 154(b) by 0 days.

(21) Appl. No.: 12/495,763

(22) Filed: Jun. 30, 2009

(65) Prior Publication Data

US 2010/0001778 A1    Jan. 7, 2010

(30) Foreign Application Priority Data

Jul. 7, 2008    (JP) .................... 2008-176667

(51) Int. Cl.
G06F 1/04 (2006.01)
H03K 3/00 (2006.01)
(52) U.S. Cl. ...................... 327/291; 327/295
(58) Field of Classification Search .......... 327/291, 327/295; 324/207.25
See application file for complete search history.

(56) References Cited

U.S. PATENT DOCUMENTS
5,517,689 A * 5/1996 Hayashihara ............. 455/205

FOREIGN PATENT DOCUMENTS
JP    2001-317962    11/2001

* cited by examiner

Primary Examiner — Lincoln Donovan
Assistant Examiner — Diana J Cheng
(74) Attorney, Agent, or Firm — David N. Lathrop

(57) ABSTRACT

An A/B-phase signal generator wherein an up/down count unit 52C counts up by an up-count command or counts down by a down-count command at fixed intervals, an angle comparison unit 51 compares the count result ACNT of up/down count unit 52C with an input rotation angle θ and generates a count request, which is an up-count request or a down-count request, a count request comparison unit 52B compares a previous count request with a next count request and generates an up-count command or a down-count command only when the previous count request and the next count request are both up-count requests or down-count requests, respectively, and an A/B-phase pulse generator 53 receives a least significant bit and a second least significant bit of up/down count unit 52C and generates and outputs an A-phase pulse signal and a B-phase pulse signal.

4 Claims, 5 Drawing Sheets

A/B-PHASE SIGNAL GENERATOR, RD CONVERTER AND ANGLE DETECTION UNIT

TECHNICAL FIELD

The present invention relates to an A/B-phase signal generator that receives angle data calculated from detected two-phase signals supplied by a resolver and outputs an A-phase pulse signal and B-phase pulse signal, and to an RD converter and an angle detection unit that incorporate the A/B-phase signal generator.

BACKGROUND ART

In an RD converter (resolver/digital converter) that receives detected two-phase signals supplied by a resolver in order to calculate the rotation angle information of the resolver, two-phase pulse signals, which are an A-phase pulse signal and a B-phase pulse signal, are used as an output form of the rotation angle information. These two pulse signals are collectively referred to below as A/B-phase pulse signals.

FIG. 4 illustrates a conventional structure of this type of RD converter that outputs rotation information as A/B-phase pulse signals. An A/D converter (analog to digital converter) 11 converts detected two-phase signals ($\sin\theta$, $\cos\theta$) supplied by the resolver into digital values and inputs them to a CPU 12 (central processing unit). CPU 12 computes a rotation angle $\theta$ at intervals equal to a specified unit time based on the digital values of the detected two-phase signals, calculates an angle increment $\Delta\theta$, which is the difference between the previous rotation angle $\theta$ and the calculated rotation angle $\theta$ obtained after the specified unit time, and gives the angle increment $\Delta\theta$ to a pulse output circuit 13.

Pulse output circuit 13 follows the timing of a clock signal CLK (not shown) to generate the same number of a sequence of up-count pulses UPCP or down-count pulses DWNCP as the value of the given angle increment $\Delta\theta$ depending on the rotation polarity of $\Delta\theta$, and gives the sequence of pulses to an up/down counter 14. Up/down counter 14 counts up or down the pulses depending on which of the up-count pulses and down-count pulses were received. Next, the least significant bit of the count value of up/down counter 14 is exclusive-ORed (XORed) with the second least significant bit by XOR circuit 15 to generate an A-phase pulse signal and the second least significant bit is output as a B-phase pulse signal, so that two-phase pulse signals (for example, see patent literature 1) are obtained, which are to be supplied to an upward system not shown in the drawings.

Patent literature 1: Japanese Patent Application Laid-Open No. 2001-317962

DISCLOSURE OF THE INVENTION

Problem to be Solved by the Invention

If A/B-phase pulse signals generated by a conventional RD converter shown in FIG. 4 are input to an upward system as the same angle information as for a rotary encoder, a problem as described below arises.

FIG. 5A illustrates the waveforms of $D_0$, which is the least significant bit, $D_1$ (B-phase pulse signal), which is the second least significant bit, DXD (A-phase pulse signal), which is obtained by exclusive-ORing $D_0$ with $D_1$, and ACNT, which is the counter value, together with the clock signal CLK in the case where angle $\theta$ increases monotonously and the counter value of up/down counter 14 increases monotonously. FIG. 5B shows the waveforms of these signals similarly as in FIG. 5A in the case where the rotation polarity is reversed in mid-course, that is, angle $\theta$ is switched from an increase to a decrease.

If the cycle period of the clock signal CLK is $T_1$, for a monotonous increase shown in FIG. 5A, the width $T_2$ of the A-phase pulse signal and the B-phase pulse signal equals $2T_1$. For a monotonous decrease, $T_2$ also equals $2T_1$. However, when the rotation polarity is reversed in mid-course, that is, angle $\theta$ is switched from an increase to a decrease as shown in FIG. 5B, a pulse having a shorter width $T'_2$ that equals $T_1$ appears in the A-phase pulse signal.

The frequency of the clock signal CLK is preferably high enough to support high-speed rotation of the resolver and angle detection at high precision. Because of restrictions imposed by an upward system on the pulse width, however, the pulse widths of A/B-phase pulse signals must be greater than a given length of time; that is, the minimum pulse width is defined.

In this case, if the pulse width $T_2$ of the A/B-phase pulse signals in FIG. 5A is set to the minimum pulse width by the upward system, the problem arises that the upward system fails to detect a pulse with width $T'_2$, which is generated when the rotation polarity is reversed in FIG. 5B.

To prevent the upward system from failing to detect the pulse, halving the frequency of the clock signal CLK is considered, but this is not preferable from the viewpoint of support for high-speed rotation or high-precision detection.

SUMMARY OF THE INVENTION

The present invention addresses the above problem with the object of providing an A/B-phase signal generator that does not generate a pulse too short for the upward system to detect and providing an RD converter and an angle detection unit that incorporate this type of A/B-phase signal generator.

The A/B-phase signal generator according to the present invention comprises: an up/down count unit that is configured to count up by an up-count command or count down by a down-count command at fixed intervals, an angle comparison unit that is configured to compare the count result of the up/down count unit with an input rotation angle and, based on the comparison result, generate a count request, which is an up-count request or a down-count request; a count request comparison unit that is configured to compare a previous count request generated by the angle comparison unit with a next count request generated by the angle comparison unit, and generate the up-count command or the down-count command only when the previous count request and the next count request are both up-count requests or down-count requests; respectively, and an A/B-phase pulse generator that is configured to receive a least significant bit and a second least significant bit of the up/down count unit and generate and outputs an A-phase pulse signal and a B-phase pulse signal.

An RD converter according to the present invention comprises an angle calculation unit that is configured to perform digital conversion of detected two-phase signals received from a resolver in order to calculate a rotation angle and the A/B-phase signal generator to which the rotation angle is input.

A angle detection unit according to the present invention comprises a resolver that is configured to output detected two-phase signals, the RD converter, and an excitation signal generator that is configured to provide the resolver with an excitation signal.

EFFECTS OF THE INVENTION

The A/B-phase signal generator according to the present invention does not generate a pulse too short for the upward system to detect when the rotation polarity is reversed. Therefore, it can easily generate A/B-phase pulse signals that support high-speed rotation and high-precision detection.

BEST MODES FOR CARRYING OUT THE INVENTION

Figure 1:
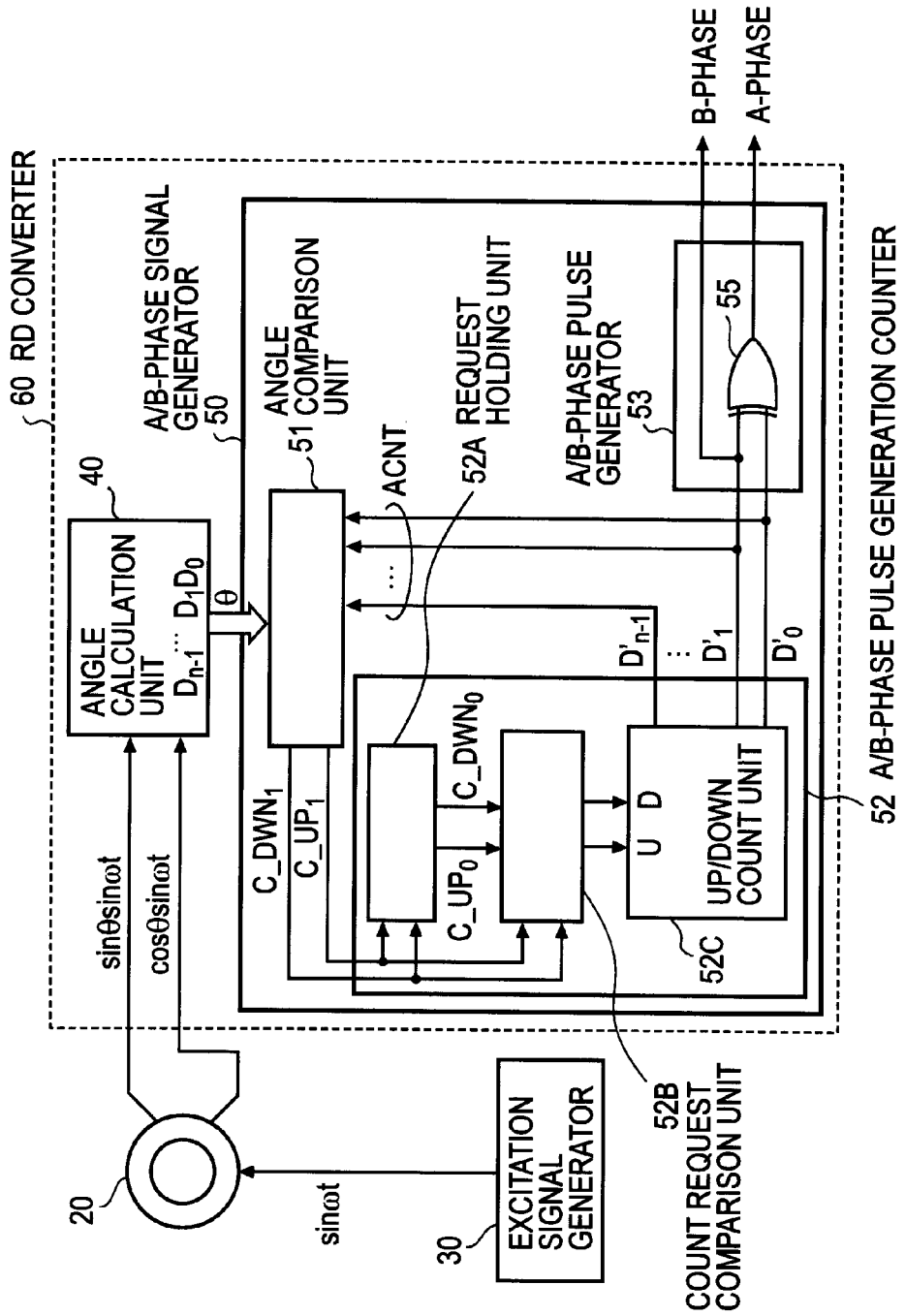
FIG. 1 is a block diagram illustrating the structure of an embodiment of the inventive A/B-phase signal generator.

The best mode of practicing the invention will now be described with reference to the drawings through an embodiment. FIG. 1 illustrates the structure of an embodiment of an A/B-phase signal generator 50 according to the present invention, together with a resolver 20, an excitation signal generator 30, and an angle calculation unit 40.

Resolver 20 is of one-phase excitation/two-phase output type and receives an excitation signal $\sin \omega t$ from an excitation signal generator 30. The detected two-phase signals $\sin \theta \sin \omega t$ and $\cos \theta \sin \omega t$ output from the resolver 20 are input to the angle calculation unit 40. The angle calculation unit 40 performs the digital conversion of the input detected two-phase signals $\sin \theta \sin \omega t$ and $\cos \theta \sin \omega t$ to calculate rotation angle $\theta$. The obtained rotation angle $\theta$ is represented by n-bit data $D_{n-1}, \ldots, D_0$.

The rotation angle $\theta$ calculated by the angle calculation unit 40 is input to A/B-phase signal generator 50. The A/B-phase signal generator 50 has an angle comparison unit 51 to which the rotation angle $\theta$ is input, an A/B-phase pulse generation counter 52, and an A/B-phase pulse generator 53. This A/B-phase signal generator 50 and the angle calculation unit 40 constitute an RD converter 60.

A/B-phase pulse generation counter 52 has a request holding unit 52A, a count request comparison unit 52B, and an up/down count unit 52C and counts up by an up-count command or counts down by a down-count command at fixed intervals. The count bits of up/down count unit 52C are n bits $D'_{n-1}, \ldots, D'_0$ as in the rotation angle $\theta$.

The angle comparison unit 51 compares the count result ACNT of A/B-phase pulse generation counter 52 with the rotation angle $\theta$ input from the angle calculation unit 40 and generates an up-count request (C_UP=1, C_DWN=0) when ACNT is less than $\theta$, a down-count request (C_UP=0, C_DWN=1) when ACNT is greater than $\theta$, or a holding count request (C_UP=0, C_DWN=0) when ACNT is equal to $\theta$.

The request holding unit 52A holds the previous count request (C_UP$_0$, C_DWN$_0$) generated by the angle comparison unit 51. The count request comparison unit 52B compares the next count request (C_UP, C_DWN) generated by the angle comparison unit 51 with the previous count request (C_UP$_0$, C_DWN$_0$) held in the request holding unit 52A and, only when the previous count request and the next count request are both up-count requests or down-count requests, generates an up-count command or down-count command, respectively, causing the up/down count unit 52C to count up or count down. Otherwise, the previous count value is kept. That is, the count request comparison unit 52B determines whether counting up or down is performed and, when the previous count request is different from the next count request (when the rotation polarity is reversed), counting up or down in this cycle is stopped.

The data of the least significant bit $D'_0$ and the second least significant bit $D'_1$ of the count value of the up/down count unit 52C is input to the A/B-phase pulse generator 53. The A/B-phase pulse generator 53 outputs the second least significant bit $D'_1$ as a B-phase pulse signal and outputs the value obtained by exclusive ORing $D'_1$ with $D'_0$ using the XOR circuit 55 as an A-phase pulse signal.

Figure 2:
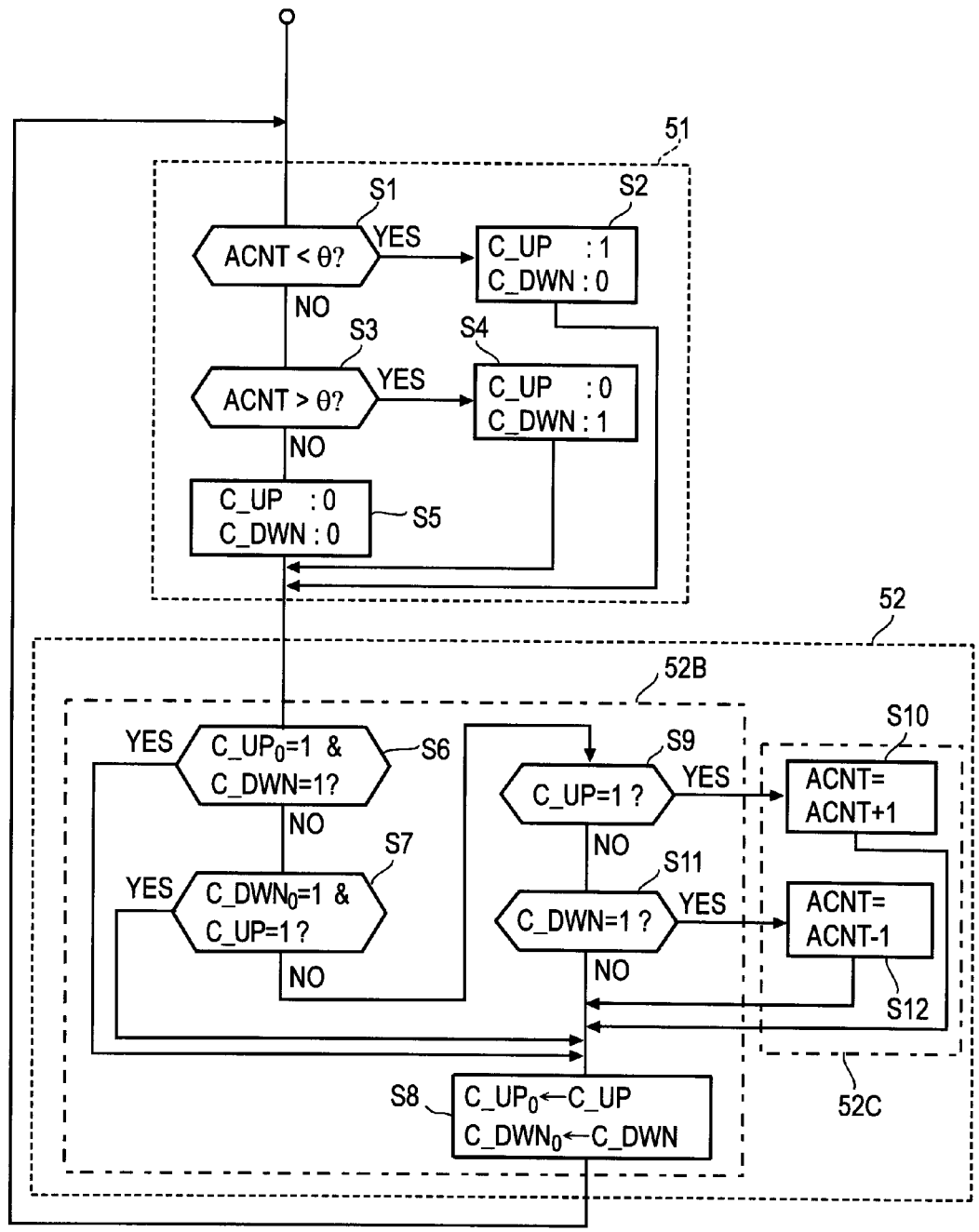
FIG. 2 is a flow chart showing the operational procedure of the A/B-phase signal generator in FIG. 1.

FIG. 2 is a flow chart showing the operational flow of the angle comparison unit 51 and the A/B-phase pulse generation counter 52 described above, where ACNT is a count value of the up/down count unit 52C, (C_UP, C_DWN)=(1, 0) is the up-count request, and (C_UP, C_DWN)=(0, 1) is the down-count request. In addition, (C_UP$_0$, C_DWN$_0$) is the previous (one cycle before) count request.

ACNT is 0 in the initial state and the operation shown in FIG. 2 is executed at intervals of a specified unit time equal to the period of the clock signal CLK.

First, the angle comparison unit 51 compares the rotation angle $\theta$ with the ACNT value (steps S1 and S3) and, if ACNT is less than the rotation angle $\theta$, outputs the up-count request (1, 0) (step S2). If ACNT is greater than the rotation angle $\theta$, it outputs the down-count request (0, 1) (step S4). If ACNT is equal to the rotation angle $\theta$, it outputs the holding count request (0, 0) (step S5).

If the count request comparison unit 52B of the A/B-phase pulse generation counter 52 receives "C_UP$_0$=1, C_DWN=1" (step S6) or "C_DWN$_0$=1, C_UP=1" (step S7), that is, the previous (one cycle before) count request differs from the next (current cycle) count request (the rotation polarity is reversed), the processing proceeds to step S8. Otherwise, if C_UP is equal to 1 (step S9), ACNT is incremented by 1 (step S10); if C_DWN is equal to 1 (step S11), ACNT is decremented by 1 (step S12). Next, the processing proceeds to step S8. If C_UP is equal to 0 in step S9 and if C_DWN is equal to 0 in step S11, the count value ACNT is kept and the processing proceeds to step S8. In step S8, the previous count request (C_UP$_0$, C_DWN$_0$) in request holding unit 52A is updated to the next count request (C_UP, C_DWN) (step S8), the processing returns to step St, and the same process is repeated.

If the rotation angle $\theta$ differs from the count value ACNT of the up/down count unit 52C, the angle comparison unit 51 always generates the up-count request or down-count request. Therefore, the count value ACNT of the up/down count unit 52C follows and then equals the rotation angle $\theta$ unless the rotation polarity is reversed. Next, A-phase and B-phase pulse signals are generated using the least significant bit and the second least significant bit of this up/down count unit 52C.

Figure 5A:
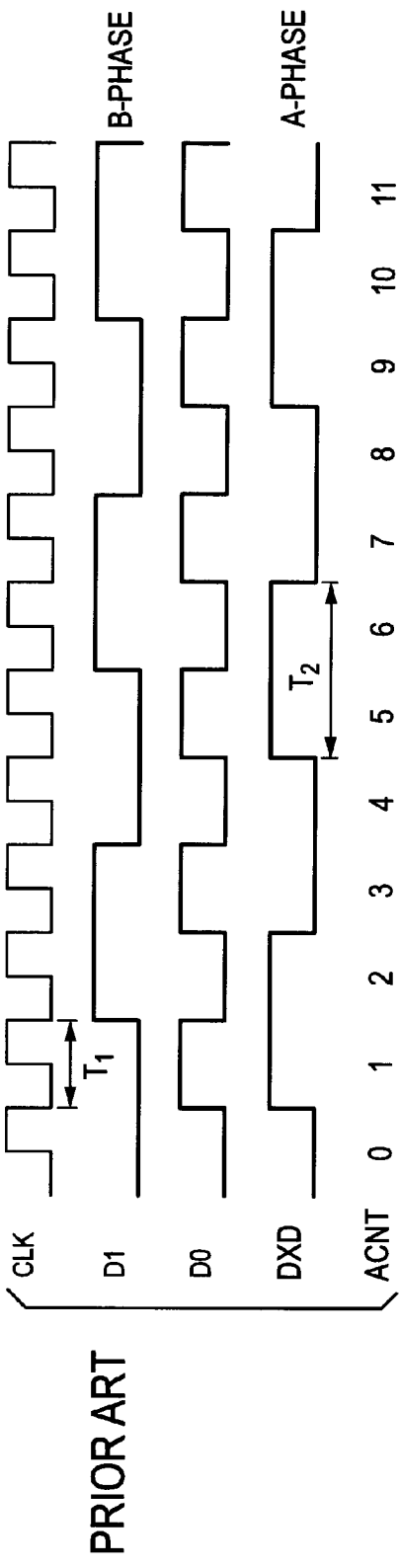
FIG. 5A shows the waveforms of signals of the RD converter in FIG. 4 when the counter value increases monotonously.
Figure 5B:
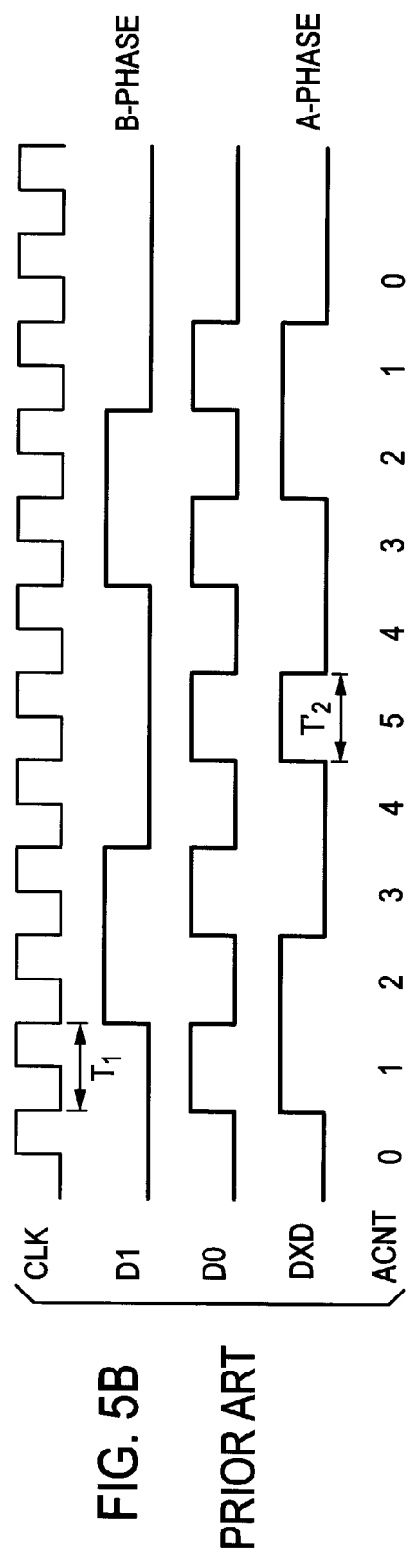
FIG. 5B shows the waveforms of signals of the RD converter when the rotation polarity is reversed.

For example, when the count value ACNT increases monotonously, the A-phase and B-phase pulse signals have the waveforms shown in FIG. 5A.

Figure 3:
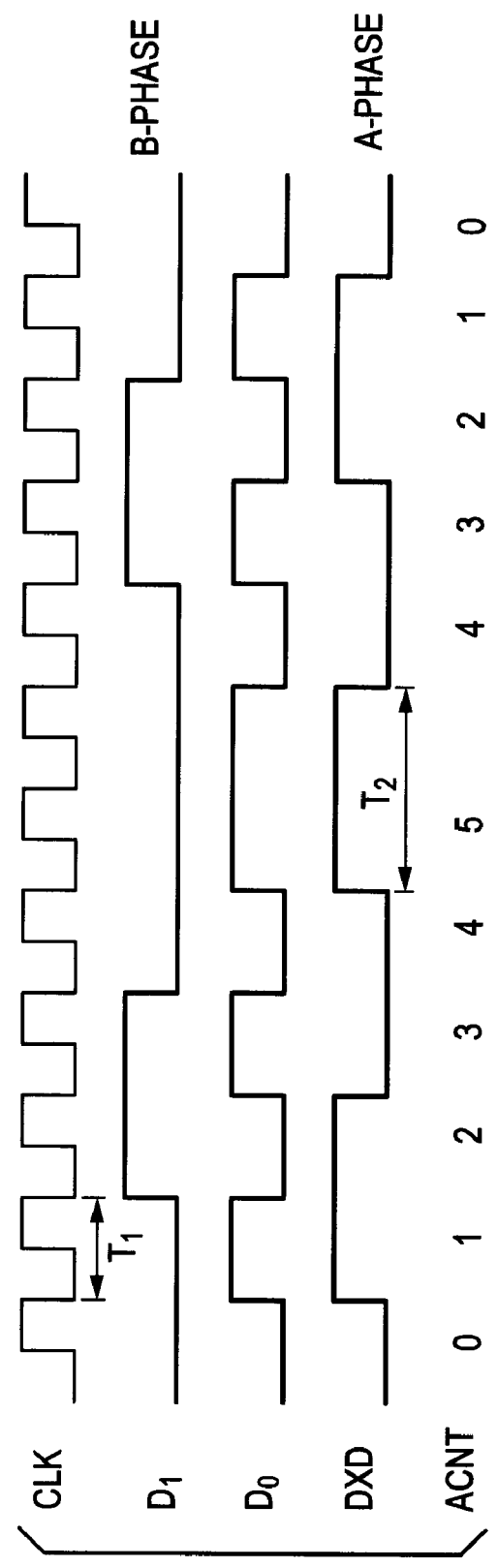
FIG. 3 shows the waveforms of signals when the rotation polarity of the A/B-phase signal generator in FIG. 1 is reversed.
Figure 4:
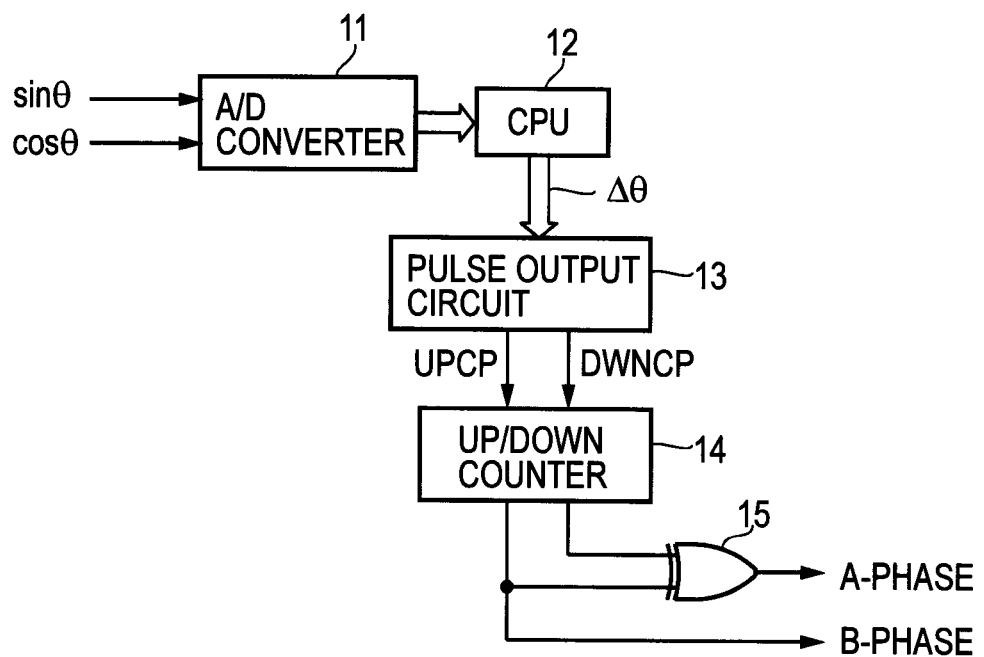
FIG. 4 is a block diagram showing an exemplary structure of a conventional RD converter.

When the rotation polarity is reversed, that is, the count request in the previous cycle differs from the count request in the next cycle, the count operation stops as described above, so the least significant bit $D'_0$ and the second least significant bit $D'_1$ are not changed as shown in FIG. 3 and the minimum pulse width is fixed to $T_2$ (=$2T_1$).

As described above, this embodiment prevents a pulse with a short width from being generated even when the rotation polarity is reversed and the minimum pulse width $T_2$ of A/B-phase pulse signals is fixed to $2T_1$, where $T_1$ is the cycle of the clock signal CLK. Therefore, the upward system does not fail to detect a pulse with a short width even when the rotation polarity is reversed.

What is claimed is:

1. An A/B-phase signal generator comprising:
   an up/down count unit that is configured to count up by an up-count command or count down by a down-count command at fixed intervals;
   an angle comparison unit that is configured to compare a count result of the up/down count unit with an input rotation angle and, based on a comparison result, generate a count request, the count request being an up-count request or a down-count request;
   a count request comparison unit that is configured to compare a previous count request generated by the angle comparison unit with a next count request generated by the angle comparison unit and generate the up-count command or the down-count command only when the previous count request and the next count request are both up-count requests or down-count requests, respectively; and
   an A/B-phase pulse generator that is configured to receive a least significant bit and a second least significant bit of the up/down count unit and generate and output an A-phase pulse signal and a B-phase pulse signal.

2. The A/B-phase signal generator of claim 1, further comprising a request holding unit that is configured to hold the previous count request generated by the angle comparison unit, wherein the count request comparison unit is configured so as to compare the next count request generated by the angle comparison unit with the previous count request held by the request holding unit.

3. An RD converter comprising an angle calculation unit that is configured to perform digital conversion of detected two-phase signals received from a resolver in order to calculate a rotation angle and the A/B-phase signal generator of claim 1 to which the rotation angle is input.

4. Angle detection unit comprising a resolver that is configured to output detected two-phase signals, the RD converter of claim 3, and an excitation signal generator that is configured to provide the resolver with an excitation signal.

* * * * *